United States Patent
Hamel

(10) Patent No.: US 9,756,702 B2
(45) Date of Patent: Sep. 5, 2017

(54) DISPLAY DEVICE WITH ADJUSTABLE RIGIDITY

(71) Applicant: Samsung Electronics Company, Ltd., Suwon (KR)

(72) Inventor: Jeffrey G. Hamel, Vancouver (CA)

(73) Assignee: Samsung Electronics Co., Ltd., Suwon (KR)

( * ) Notice: Subject to any disclaimer, the term of this patent is extended or adjusted under 35 U.S.C. 154(b) by 195 days.

(21) Appl. No.: 14/700,045

(22) Filed: Apr. 29, 2015

(65) Prior Publication Data

US 2016/0323966 A1    Nov. 3, 2016

(51) Int. Cl.
*H05B 33/26* (2006.01)
*H01L 51/00* (2006.01)
*H01L 27/00* (2006.01)

(52) U.S. Cl.
CPC ............. *H05B 33/26* (2013.01); *H01L 27/00* (2013.01); *H01L 51/0097* (2013.01); *H01L 2251/5338* (2013.01); *Y02E 10/549* (2013.01)

(58) Field of Classification Search
CPC ................ H01L 27/00; H01L 51/0097; H01L 2251/5338; H05B 33/26
See application file for complete search history.

(56) References Cited

U.S. PATENT DOCUMENTS

| 5,810,126 A | 9/1998 | Kordonsky |
| 2010/0141407 A1* | 6/2010 | Heubel ................. G06F 1/163 340/407.1 |
| 2012/0075732 A1 | 3/2012 | Griffith |
| 2013/0044215 A1 | 2/2013 | Rothkopf |
| 2013/0083496 A1 | 4/2013 | Franklin |

* cited by examiner

*Primary Examiner* — Donald Raleigh
*Assistant Examiner* — Kevin Quarterman
(74) *Attorney, Agent, or Firm* — Baker Botts L.L.P.

(57) ABSTRACT

In one embodiment, a device includes a first sheet configured to flex; a second sheet disposed below the first sheet; and an intermediate region disposed between the sheets. The intermediate region may include multiple supports, each of the supports connected to portions of the first and second sheets and configured to maintain a spacing between the sheets. The intermediate region may also include multiple channels configured to contain a fluid in the spacing between the sheets, each of the channels disposed between two or more supports. The fluid is configured to be in an active or an inactive state. When the fluid is in the inactive state, the device is substantially flexible, and when the fluid is in the active state, the device is substantially rigid.

20 Claims, 10 Drawing Sheets

DISPLAY DEVICE WITH ADJUSTABLE RIGIDITY

TECHNICAL FIELD

This disclosure generally relates to devices with flexible displays.

BACKGROUND

Flexible displays include displays that may be bent, flexed, or twisted into a variety of curved shapes. There are a number of different types of displays, such as for example, electrophoretic displays, liquid crystal displays (LCDs), light-emitting diode (LED) displays, organic light-emitting diode (OLED) displays, and organic field-effect transistor (OFET) displays. A flexible display may be attached to or provided as part of a smartphone, wearable device (e.g., a smart watch), personal digital assistant (PDA), portable media player, or other suitable device. Flexible displays may include a touch sensor that may detect the presence or location of a touch or an object (e.g., a user's finger or a stylus) within a touch-sensitive area of the touch sensor. A touch sensor may enable a user to interact directly with what is displayed on a display.

DESCRIPTION OF EXAMPLE EMBODIMENTS

Figure 1:
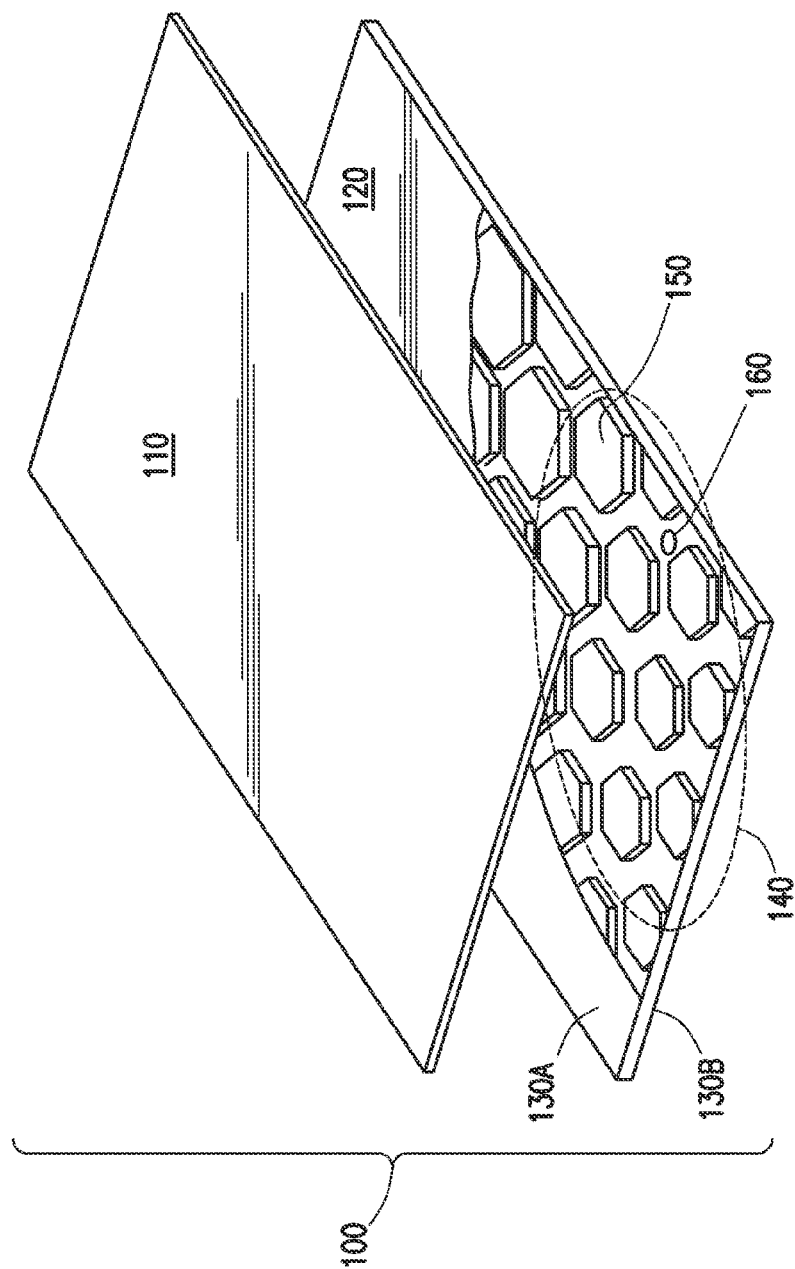
FIG. 1 illustrates an exploded view of an example display device.

FIG. 1 illustrates an exploded view of an example display device 100. In particular embodiments, display device 100 may include a computer system such as an e-book reader, global positioning system (GPS) device, camera, personal digital assistant (PDA), handheld electronic device, tablet device, cellular telephone, smartphone, other suitable electronic device, or any suitable combination thereof. In particular embodiments, display device 100 may include a power source (e.g., a battery), a wireless device for sending or receiving information using a wireless communication protocol (e.g., BLUETOOTH, WI-FI, or cellular), a processor, a touch sensor, or any other suitable device. In particular embodiments, display device 100 may include flexible display 110 and adjustable-rigidity apparatus 120. Flexible display 110 may be configured to display text, digital images, or video. Flexible display 110 may be configured to bend, flex, or twist into a variety of curved shapes. Additionally, flexible display 110 may be configured to assume a substantially flat shape, as illustrated in FIG. 1. As an example and not by way of limitation, flexible display 110 may lie substantially flat when placed on a flat surface, and flexible display 110 may be capable of being rolled into a substantially spiral or tubular shape. Flexible display 110 may include any suitable type of display, such as for example an electrophoretic display, a liquid crystal display (LCD), a light-emitting diode (LED) display, an organic light-emitting diode (OLED) display, or an organic field-effect transistor (OFET) display. This disclosure contemplates any suitable type of display having any suitable amount of flexibility.

In particular embodiments, adjustable-rigidity apparatus 120 may include top sheet 130A, bottom sheet 130B (located below top sheet 130A), and intermediate region 140 located between sheets 130A and 130B. In particular embodiments, adjustable-rigidity apparatus 120 may be configured to bend, flex, or twist into a variety of curved shapes. Additionally, apparatus 120 may be configured to assume a substantially flat shape, as illustrated in FIG. 1. In particular embodiments, top sheet 130A may be configured to flex (or assume a substantially flat shape, as illustrated in FIG. 1). As an example and not by way of limitation, top sheet 130A may be made of a flexible material and may be configured to bend, flex, or twist. Top sheet 130A may be made of or may include one or more of the following materials: polyvinyl chloride (PVC), polyethylene, polypropylene, polyester, polyimide, polyamide, rubber (natural or synthetic), or any other suitable flexible material. In particular embodiments, top sheet 130A may be made of a single material (e.g., PVC, polyethylene, etc.), or top sheet 130A may be made of two or more materials. As an example and not by way of limitation, top sheet 130A may be made of two or more layers of materials (e.g., a layer of synthetic rubber with a coating or a layer of polyimide film attached to each surface of the rubber layer). In particular embodiments, bottom sheet 130B may be configured to flex and may be made of one or more flexible materials similar to top sheet 130A, as described above. In other particular embodiments, bottom sheet 130B may include a substantially rigid or inflexible material, and bottom sheet 130B may be configured to retain a particular shape or not be easily flexed. As an example and not by way of limitation, bottom sheet 130B may be made from a hard plastic (e.g., polycarbonate or acrylonitrile butadiene styrene) or any other suitable substantially rigid material configured to retain a particular shape. Although this disclosure describes and illustrates particular sheets made of particular materials, this disclosure contemplates any suitable sheets made of any suitable materials.

In particular embodiments, intermediate region 140 may be configured to bend, flex, or twist into a variety of curved shapes. Additionally, intermediate region 140 may be configured to assume a substantially flat shape, as illustrated in FIG. 1. In particular embodiments, intermediate region 140 may include multiple supports 150 and multiple channels 160. In particular embodiments, supports 150 may be made of a flexible or semi-flexible material such that intermediate region may be able to flex, bend or be rolled up into a substantially spiral or tubular shape. As an example and not by way of limitation, supports 150 may be made of one or more of the following materials: polyvinyl chloride, polyethylene, polypropylene, polyester, polyimide, polyamide, rubber (natural or synthetic), or any other suitable flexible material. In particular embodiments, supports 150 may have any suitable shape or combination of suitable shapes, such as for example, hexagonal (as illustrated in FIG. 1), square, circular, ellipsoidal, triangular, rectangular, or any other suitable shape. In particular embodiments, supports 150 may have similar sizes or dimensions (e.g., a width along a direction within a plane of intermediate region 140). As an example and not by way of limitation, supports 150 may have a width of approximately 0.1 mm, 1 mm, 10 mm, or 100 mm, or any suitable width. In other particular embodiments, supports 150 may have different sizes. As an example and not by way of limitation, a width of supports 150 may gradually increase or decrease along an axis of a plane formed by intermediate region 140. Although this disclosure describes and illustrates particular supports having particular shapes and particular dimensions and being made from particular materials, this disclosure contemplates any suitable supports having any suitable shapes and any suitable dimensions and being made from any suitable materials.

In particular embodiments, each support 150 may be connected to portions of top sheet 130A and bottom sheet 130B, and supports 150 may maintain a spacing between sheets 130A and 130B. As an example and not by way of limitation, each support may have a top surface attached to an interior surface of top sheet 130A (e.g., a surface of top sheet 130A facing toward intermediate region 140) using an adhesive or epoxy that forms a flexible bond. Similarly, each support may have a bottom surface that is attached to an interior surface of bottom sheet 130B. In particular embodiments, supports 150 may be configured to maintain a substantially uniform spacing between sheets 130A and 130B. As an example and not by way of limitation, each support 150 may have a height of approximately 0.1 mm, 1 mm, 10 mm, or 100 mm, or any suitable height. Depending on the height of supports 150, sheets 130A and 130B may be spaced approximately 0.1 mm, 1 mm, 10 mm, or 100 mm apart, or may be spaced apart by any suitable separation distance. For example, each support may have a height of approximately 1 mm, and sheets 130A and 130B may be spaced approximately 1 mm apart. In particular embodiments, each support 150 may have a height that is substantially the same, and the separation between sheets 130A and 130B may be substantially uniform across an extent of apparatus 120. In other particular embodiments, supports 150 may have heights that vary along one or more axes of apparatus 120. As an example and not by way of limitation, supports 150 may have uniform heights along a first axis and may have heights that gradually increase (e.g., from 0.5 mm to 2 mm) along a second axis orthogonal to the first axis. In particular embodiments, supports 150 may be made of an elastic or stretchable material that allows supports to expand or contract along an axis substantially orthogonal to a plane of sheet 130A or 130B. As an example and not by way of limitation, supports 150 may be configured to stretch, allowing portions of sheet 130A to move or flex with respect to sheet 130B. In particular embodiments, supports 150 may be made from a similar or same material as sheets 130A or 130B. In particular embodiments, supports 150 and sheet 130A or 130B may be made from the same material or may be manufactured or formed together. As an example and not by way of limitation, sheets 130A and 130B and supports 150 may be made from the same plastic material and may be directly connected together without epoxy or adhesive. As such, there may be no distinct bonds or boundaries between sheets 130A and 130B and supports 150 since they are made from the same material. Although this disclosure describes and illustrates particular supports having particular heights and being connected to one or more sheets in a particular manner, this disclosure contemplates any suitable supports having any suitable heights and being connected to one or more sheets in any suitable manner.

In particular embodiments, each channel 160 may be located between two or more supports 150, and each channel 160 may be configured to contain a fluid. The fluid may be a gas, liquid, gel, or paste, and the fluid may be contained within each channel 160, between interior surfaces of sheets 130A and 130B and between surfaces of supports 150. In particular embodiments, sheets 130A and 130B may be impervious to the fluid, thus preventing the fluid from leaking or flowing through the sheets. In particular embodiments, one or more ends or sides of apparatus 120 may be closed or sealed to contain the fluid within channels 160 and to prevent the fluid from leaking out of intermediate region 140. As an example and not by way of limitation, edges of top sheet 130A and bottom sheet 130B may be sealed or bonded together so that the fluid is contained within channels 160 of intermediate region 140. As another example and not by way of limitation, intermediate region 140 may include a sealant (e.g., silicone, or a material similar to that of supports 150) distributed around edges of intermediate region 140 and configured to contain the fluid within intermediate region 140. In particular embodiments, each channel 160 may have a dimension (e.g., a width along a direction within a plane of intermediate region 140) that is substantially the same across an extent of intermediate region 140. As an example and not by way of limitation, channels 160 may have a width of approximately 0.1 mm, 1 mm, 10 mm, or 100 mm, or any suitable width. In other particular embodiments, channels 160 may have different dimensions or dimensions that vary. As an example and not by way of limitation, a width of channels 160 may gradually increase or decrease along an axis of a plane formed by intermediate region 140. In particular embodiments, channels 160 may have any suitable cross-sectional shape, such as for example, square, rectangular, circular, elliptical, or any other suitable shape or suitable combination of shapes. Although this disclosure describes and illustrates particular channels having particular widths and particular shapes, this disclosure contemplates any suitable channels having any suitable widths and any suitable shapes.

In particular embodiments, adjustable-rigidity apparatus 120 may have a layered or sandwich structure in which planes associated with sheets 130A and 130B and intermediate region 140 are located parallel to and facing one another. As an example and not by way of limitation, top sheet 130A, intermediate region 140, and bottom sheet 130B may combine to form a layered or sandwich-type structure in which a surface of sheet 130A is in contact with or is bonded to a surface of intermediate region 140, and a surface of sheet 130B is in contact with or is bonded to another surface of intermediate region 140. A sandwich structure formed by intermediate region 140 and sheets 130A and 130B may cause top sheet 130A, intermediate region 140, or bottom sheet 130B to flex or move in unison or to each form similar shapes. As an example and not by way of limitation, if intermediate region 140 lies flat or flexes into a particular shape, then top sheet 130A may follow along and also lie flat or flex into a shape that is similar to the particular shape of the of the flexed intermediate region 140.

In particular embodiments, flexible display 110 may be attached to sheet 130A of apparatus 120. As an example and not by way of limitation, flexible display 110 may be bonded to an outer or exterior surface of sheet 130A (e.g., a surface facing away from intermediate region 140) using an adhesive or epoxy that forms a flexible bond between display 110 and sheet 130A. This disclosure contemplates any suitable type of adhesive, epoxy, or other suitable means for attaching flexible display 110 to sheet 130A. In particular embodiments, top sheet 130A may include flexible display 110. As an example and not by way of limitation, display device 100 may not include a separate or discrete flexible display 110; rather, flexible display 110 may be integrated into or combined with top sheet 130A. As another example and not by way of limitation, flexible display 110 may function as top sheet 130A with the display of flexible display 110 facing outward and away from intermediate region 140 and with a surface opposite the display facing toward and in contact with a portion of intermediate region 140.

Figure 2:
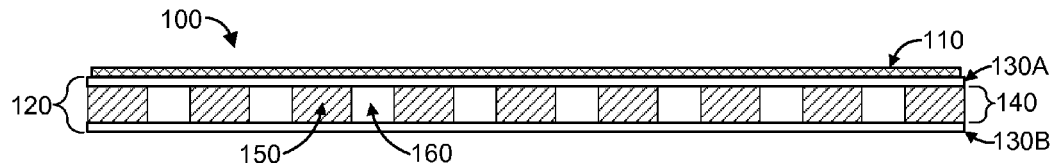
FIGS. 2-5 each illustrate a side view of an example display device.
Figure 3:
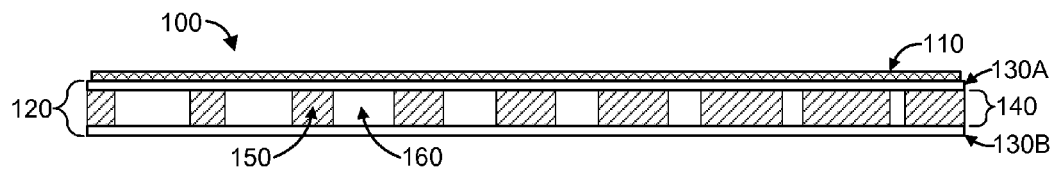
Figure 4:
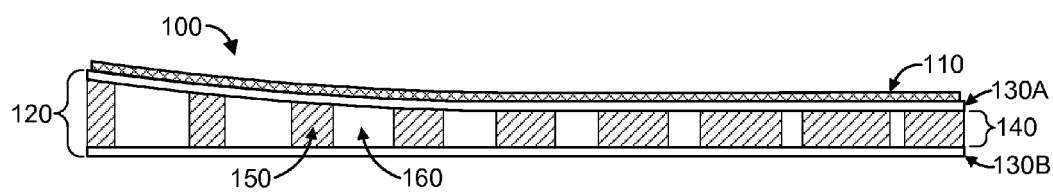
Figure 5:
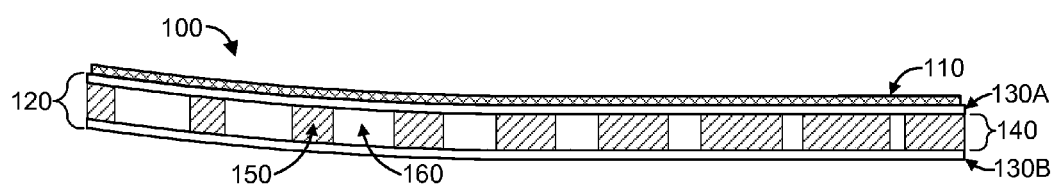

FIGS. 2-5 each illustrate a side view of an example display device 100. In the examples of FIGS. 2-5, display device 100 includes flexible display 110 and adjustable-rigidity apparatus 120. In FIG. 2, apparatus 120 has supports 150 and channels 160 with substantially uniform heights. Additionally, the widths of supports 150 are substantially uniform, and the widths of channels 160 are also substantially uniform. In FIG. 3, the widths of supports 150 gradually increase going from left to right, while the widths of channels 160 gradually decrease going from left to right. In the examples of FIGS. 4 and 5, display device 100 is shown in a flexed state. In FIG. 4, the left portions of flexible display 110 and top sheet 130A are flexed away from intermediate region 140, and bottom sheet 130B remains in a flat, unflexed state. In the example of FIG. 4, top sheet 130A may be made of a flexible material, and bottom sheet 130B may be made of a substantially rigid or inflexible material. Additionally, supports 150 may be made of an elastic or stretchable material that allows one or more portions of top sheet 130A to move toward or away from bottom sheet 130B, as illustrated in FIG. 4. In FIG. 5, the left portion of display device 100 is flexed upward with the left portions of flexible display 110, top sheet 130A, intermediate region 140, and bottom sheet 130B each being in a flexed state. In the example of FIG. 5, top sheet 130A and bottom sheet 130B may each be made of a flexible material. Although this disclosure describes and illustrates particular adjustable-rigidity apparatuses with particular arrangements and sizes of particular supports and channels, this disclosure contemplates any suitable adjustable-rigidity apparatuses with any suitable arrangements and sizes of any suitable supports and channels.

In particular embodiments, adjustable-rigidity apparatus 120 may be configured to have an adjustable, variable, or controllable amount of rigidity. The rigidity of adjustable-rigidity apparatus 120 may refer to an amount of stiffness or an amount that apparatus 120 resists bending or flexing in response to an applied force. As an example and not by way of limitation, when apparatus 120 is in a low-rigidity (or, inactive) state, a person may be able to bend or roll display device 100 (e.g., into a circular shape), and when apparatus 120 is in a high-rigidity (or, active) state, it may be relatively difficult to bend or flex apparatus 120. As another example and not by way of limitation, display device 100 may be a handheld device that, when in a high-rigidity state, maintains its shape so that a person can hold display device 100 with one two or more fingers or with one hand. Additionally, in a high-rigidity state, a person may be able to press on flexible display 110 with a finger or stylus (e.g., to interact with display device 100 using a touch sensor) without substantially deforming or bending display device 100. In a high-rigidity state, display device 100 may maintain a substantially flat shape (e.g., similar to display devices 100 illustrated in FIGS. 2-3) or may maintain a substantially curved or flexed shape (e.g., similar to display devices 100 illustrated in FIGS. 4-5).

In particular embodiments, an amount of stiffness or rigidity of adjustable-rigidity apparatus 120 may be characterized by a Young's modulus associated with apparatus 120, where Young's modulus refers to a ratio of stress applied to a portion of apparatus 120 to the resulting strain. As an example and not by way of limitation, when apparatus 120 is in a low-rigidity state, a portion of apparatus 120 may have a Young's modulus of less than 0.001 GPa, 0.01 GPa, 0.1 GPa, or less than any suitable value. When apparatus 120 is in a high-rigidity state, a portion of apparatus 120 may have a Young's modulus of greater than or equal to 0.001 GPa, 0.01 GPa, 0.1 GPa, respectively, or greater than or equal to any suitable value. In particular embodiments, an amount of stiffness or rigidity of adjustable-rigidity apparatus 120 may be characterized by a ratio of a force applied to apparatus 120 to an amount of deflection of apparatus 120 resulting from the applied force. As an example and not by way of limitation, adjustable rigidity apparatus 120 may be substantially flat (e.g., as illustrated by the examples in FIGS. 2 and 3) when it is in a high-rigidity state, and a force applied orthogonal to a surface of apparatus 120 may result in a bending or deflection of display device. When apparatus 120 is in a high-rigidity state, apparatus 120 may have a stiffness of greater than or equal to 0.01 N/mm, 0.1 N/mm, 1 N/mm, 10 N/mm, or greater than or equal to any suitable stiffness value. When apparatus 120 is in a low-rigidity state, apparatus 120 may have a stiffness of less than 0.01 N/mm, 0.1 N/mm, 1 N/mm, 10 N/mm, respectively, or less than any suitable stiffness value. Although this disclosure describes particular adjustable-rigidity apparatuses having particular amounts of stiffness characterized in particular manners, this disclosure contemplates any suitable adjustable-rigidity apparatus having any suitable amount of stiffness characterized in any suitable manner.

In particular embodiments, a user may interact with display device 100 to put it into an active or inactive state, where display device 100 has relatively high rigidity in an active state and is relatively flexible (or has relatively low-rigidity) in an inactive state. As an example and not by way of limitation, a user may activate a switch or interact with a touch sensor of display device 100 to put display device 100 into an active state (e.g., so that the user may view an image on flexible display 110 or make a phone call with display device 100). Afterwards, when the user is finished using display device 100, they may put display device 100 into an inactive state so that they can bend, fold or roll display device 100 into a compact shape for storage or into a shape that may be wearable on their body.

In particular embodiments, intermediate region 140 may include a fluid contained in channels 160 and in the spacing between sheets 130A and 130B. In particular embodiments, the fluid may be configured to be in an active or an inactive state. When the fluid is in the inactive state, adjustable-rigidity apparatus 120 (or display device 100) may be substantially flexible, and when the fluid is in the active state, adjustable-rigidity apparatus 120 (or display device 100) may be substantially rigid. In particular embodiments, a fluid contained in channels 160 may exhibit a change in a physical property (e.g., viscosity, volume, pressure, density, stiffness, or any other suitable physical property) when the fluid is changed from an active state to an inactive state, and vice versa. As an example and not by way of limitation, when the fluid in channels 160 is switched from inactive to active, the viscosity of the fluid may increase such that display device 100 exhibits a substantially rigid shape. As another example and not by way of limitation, activation of the fluid in channels 160 may cause an expansion or volume increase of a portion of the fluid, resulting in a corresponding expansion of a portion of display device 100, as illustrated by the expanded left portion of display device 100 in the example of FIG. 4. As another example and not by way of limitation, activation of the fluid in channels 160 may increase the pressure of the fluid such that display device 100 exhibits a substantially rigid shape.

In particular embodiments, when a fluid contained in channels 160 is in an active state, a portion of display device 100 may be configured to maintain a substantially flat shape (e.g., as illustrated by the example devices 100 in FIGS. 2-3). In other particular embodiments, when a fluid contained in channels 160 is in an active state, a portion of display device 100 may be configured to maintain a substantially curved, bent, or flexed shape (e.g., as illustrated by the example devices 100 in FIGS. 4-5). In particular embodiments, a fluid being in an active or inactive state may also be referred to as device 100, apparatus 120, intermediate region 140, or channels 160 being in an active or inactive state, respectively. As an example and not by way of limitation, when the fluid in display device 100 is activated, display device 100 or adjustable-rigidity apparatus 120 may be referred to as being in an active state. In particular embodiments, a fluid contained in channels 160 may be configured to be in one or more semi-active states, where when the fluid is in a semi-active state, device 100 is semi-rigid and has an intermediate rigidity between a substantially flexible inactive state and a substantially rigid active state. As an example and not by way of limitation, a user may set the fluid in display device 100 to a particular semi-active state so that display device has a particular amount of rigidity. Although this disclosure describes and illustrates particular fluids configured to provide particular changes in particular physical properties, this disclosure contemplates any suitable fluids configured to provide any suitable changes in any suitable physical properties.

In particular embodiments, adjustable-rigidity apparatus 120 may include two or more electrodes configured to receive a voltage applied between the electrodes and produce an electric field that extends through the fluid of one or more channels 160 of intermediate region 140. As an example and not by way of limitation, an applied voltage may have a magnitude of approximately 1 V, 10 V, 100 V, or 1 kV, or any suitable voltage. An electric field resulting from an applied voltage may have a magnitude of approximately 100 V/m, 1 kV/m, 10 kV/m, 100 kV/m, or any suitable electric field value. In particular embodiments, the electric field may have a magnitude proportional to the applied voltage. In particular embodiments an applied voltage may be a constant voltage (e.g., a DC, or direct-current, voltage) or may be a time-varying voltage (e.g., an alternating, variable, or pulsating voltage). In particular embodiments, electrodes may include a thin film or foil of electrically conductive material (e.g., gold, silver, copper, aluminum, chrome, an electrically conductive form of carbon, or any suitable conductive material or suitable combination of conductive materials) deposited on or applied to a surface of apparatus 120 (e.g., a surface of top sheet 130A, bottom sheet 130B, or supports 150). As an example and not by way of limitation, an electrode may be made of a thin copper foil and may be attached to a portion of a surface of top sheet 130A. Although this disclosure describes particular electrodes made of particular materials, this disclosure contemplates any suitable electrodes made of any suitable materials.

In particular embodiments, top sheet 130A may include two or more electrodes, and one or more voltages may be applied between two or more top-sheet electrodes. In particular embodiments, bottom sheet 130B may include two or more electrodes, and one or more voltages may be applied between two or more bottom-sheet electrodes. In particular embodiments, top sheet 130A and bottom sheet 130B may each include one or more electrodes, and one or more voltages may be applied between one or more top-sheet electrodes and one or more bottom-sheet electrodes. As an example and not by way of limitation, top sheet 130A may include a single electrode, and bottom sheet 130B may include a single electrode. A voltage applied between the top and bottom electrodes may produce a substantially uniform electric field that extends through the fluid in channels 160. When a nonzero voltage is applied between the top and bottom electrodes, the fluid in channels 160 may become activated. As another example and not by way of limitation, top sheet 130A may include multiple electrodes, and bottom sheet 130B may include a single electrode. One or more voltages may be applied to one or more respective electrodes of top sheet 130A with the bottom-sheet electrode acting as a ground plane. The one or more applied voltages may be used to selectively activate portions of the fluid in channels 160. This disclosure also contemplates a similar configuration where top sheet 130A includes a single ground-plane electrode, and bottom sheet 130B includes multiple electrodes. As another example and not by way of limitation, top sheet 130A may include multiple electrodes, and bottom sheet 130B may include multiple electrodes. One or more voltages may be applied between one or more electrodes of top sheet 130A and one or more electrodes of bottom sheet 130B. For example, one or more voltages may be applied to one or more electrodes of sheet 130A and 130B to activate fluid adjacent to those electrodes, while fluid adjacent to electrodes with zero or no applied voltage may not be activated. In particular embodiments, adjustable-rigidity apparatus 120 may include multiple electrodes, and the fluid adjacent to one or more of the electrodes may be activated to cause apparatus 120 to take on a particular shape, and different patterns, sizes, or distributions of electrodes, supports 150, or channels 160 may be used to form different shapes of apparatus 120. Additionally, different configurations of applied voltages to the electrodes may, for a particular adjustable-rigidity apparatus 120, be used to configure apparatus 120 into a variety of different shapes (e.g., flat, curved, or folded). Although this disclosure describes particular adjustable-rigidity apparatuses having particular electrodes configured and distributed in particular manners, this disclosure contemplates any suitable adjustable-rigidity apparatuses having any suitable electrodes configured and distributed in any suitable manner.

In particular embodiments, a fluid contained in channels 160 may be an electrically controlled fluid where the electrically controlled fluid is in an inactive state when an applied voltage (and a corresponding electric field) is approximately zero, and the electrically controlled fluid is in an active state when the applied voltage is nonzero. In particular embodiments, an electrically controlled fluid may refer to a fluid with a physical property (e.g., viscosity, volume, pressure, density, stiffness, or any other suitable physical property) that changes when an electrical field is applied across the fluid or an electrical current is passed through the fluid. As an example and not by way of limitation, the fluid in channels 160 may be a colloidal suspension (e.g., a suspension of microscopically dispersed insoluble particles—colloids—in a liquid or gel-like substance), and the colloids may be controlled or manipulated by an externally applied electric field to change the viscosity, volume, pressure, or density of the fluid. As another example and not by way of limitation, an applied electric field may manipulate small particles suspended in a carrier fluid through electrophoresis (e.g., the small particles may be made to move or migrate in a way that changes a physical property of the fluid). As another example and not by way of limitation, the fluid in channels 160 may be an electrorheological (ER) fluid. For example, an ER fluid may include a suspension of small (e.g., less than 50 micrometers in diameter) non-conductive particles in an electrically insulating fluid (e.g., an oil). When an electrical field is applied to the ER fluid, the viscosity of the ER fluid increases causing the ER fluid to change from liquid or gel-like (with no applied electric field) to a material with increased viscosity or rigidity. For example, display device 100 may be configured to be rolled up into a circular or spiral shape when no voltage is applied and the ER fluid is in an inactive state. When a voltage is applied, the viscosity of the ER fluid increases, and display device 100 may be configured to form a substantially flat and rigid shape (e.g., as illustrated in the examples of FIGS. 2-3) or a substantially curved and rigid shape (e.g., as illustrated in the examples of FIGS. 4-5). Although this disclosure describes particular adjustable-rigidity apparatuses having particular electrically controlled fluids, this disclosure contemplates any suitable adjustable-rigidity apparatuses having any suitable electrically controlled fluids.

In particular embodiments, adjustable-rigidity apparatus 120 may include one or more electromagnets, where each electromagnet is configured to receive an electric current and produce a magnetic field based on the received electric current. As an example and not by way of limitation, one or more electromagnets may be included in a portion of sheet 130A or 130B, and each electromagnet may produce a magnetic field that extends, at least in part, into one or more channels 160. As another example and not by way of limitation, one or more supports 150 may each include an electromagnet. Each electromagnet may include an electrical conductor (e.g., a wire or a thin film of metal) coiled around a magnetic core material (e.g., iron or steel), and when an electric current is passed through the conductor, the electromagnet produces a magnetic field proportional to the amount of electric current. When no current is applied to an electromagnet, the electromagnet produces little or no magnetic field. The electric current supplied to an electromagnet may be a direct current or a time-varying current (e.g., an alternating, variable, or pulsating current), and based on the electric current, the corresponding magnetic field produced by the electromagnet may be a constant magnetic field or a time-varying magnetic field, respectively. This disclosure contemplates any suitable electromagnet configured to produce any suitable magnetic field.

In particular embodiments, a fluid contained in channels 160 may be a magnetically controlled fluid. The magnetically controlled fluid may be in an inactive state when it is exposed to little or no magnetic field (e.g., no current is applied to the electromagnets). A portion of the magnetically controlled fluid may be in an active state when exposed to a nonzero magnetic field (e.g., one or more currents are applied to one or more respective electromagnets). The magnetic field may be proportional to the electric current, and the magnetic field (or a portion thereof) may extend through the fluid of one or more channels 160 of intermediate region 140. In particular embodiments, a magnetically controlled fluid may refer to a fluid with a physical property (e.g., viscosity, volume, pressure, density, stiffness, or any other suitable physical property) that changes when a magnetic field is applied to the fluid. As an example and not by way of limitation, the fluid in channels 160 may be a ferrofluid or a magnetorheological (MR) fluid. For example, a ferrofluid or MR fluid may include a suspension of ferromagnetic particles with sizes on the order of nanometers to micrometers in a carrier fluid (e.g., oil, water, or an organic solvent). When a magnetic field is applied to a ferrofluid or MR fluid, the viscosity of the fluid may increase, causing the fluid to change from liquid or gel-like (with no applied magnetic field) to a material with increased viscosity or rigidity. For example, display device 100 may be configured to be rolled up into a circular or spiral shape when the MR fluid is in an inactive state. When the MR fluid is activated, the viscosity of the MR fluid increases, and display device 100 may be configured to form a substantially flat and rigid shape (e.g., as illustrated in the examples of FIGS. 2-3) or a substantially curved and rigid shape (e.g., as illustrated in the examples of FIGS. 4-5). Although this disclosure describes particular adjustable-rigidity apparatuses having particular magnetically controlled fluids, this disclosure contemplates any suitable adjustable-rigidity apparatuses having any suitable magnetically controlled fluids.

In particular embodiments, adjustable-rigidity apparatus 120 may include one or more electromagnets configured to work in unison. When the electromagnets are activated, a magnetic field is produced that causes the viscosity of the magnetically controlled fluid to increase, which in turn causes apparatus 120 to form a particular shape and become substantially rigid. In other particular embodiments, adjustable-rigidity apparatus 120 may include multiple electromagnets in various locations, and different configurations of current applied to the electromagnets may be used to configure apparatus 120 into a variety of different shapes (e.g., flat, curved, or folded).

In particular embodiments, a fluid contained in channels 160 may be a gas (e.g., air, nitrogen, or carbon dioxide). As an example and not by way of limitation, the fluid may be air, and when adjustable-rigidity apparatus 120 is in a low-rigidity (or, inactive) state, there may be little or no air contained in channels 160, or the air in channels 160 may have a pressure less than or approximately equal to the ambient pressure outside of apparatus 120. In particular embodiments, high-rigidity apparatus 120 may include a pump or an air compressor configured to pump air into one or more channels 160 of intermediate region 140 when the air or apparatus 120 is in an active state. When apparatus 120 is in a high-rigidity (or, active) state, air may be pumped into channels 160, causing the air pressure in channels 160 to become greater than the ambient pressure outside of apparatus 120 and causing apparatus 120 to be in a high-rigidity state. As an example and not by way of limitation, when apparatus 120 is in an active state, the air pressure in channels 160 may be 1-10 psi greater than the ambient air pressure outside of apparatus 120. In particular embodiments, when apparatus 120 is in an inactive state, the air in channels 160 may be released into the environment surrounding apparatus 120. As an example and not by way of limitation, the pump may pump the air out of channels 160, or the pump may allow the air to flow out of channels 160. In an inactive state, channels 160 may contain little or no air, and apparatus 120 may have low rigidity and may be flexible. In particular embodiments, channels 160 of apparatus 120 may be connected together, and an air pump may control the air pressure or air content in channels 160 so that apparatus 120 forms a particular shape when activated. In other particular embodiments, there may be multiple distinct channels 160, and one or more air pumps may independently control the air pressure of each distinct channel 160. As an example and not by way of limitation, apparatus 120 may be configured to form a variety of different shapes (e.g., flat, curved, or folded) depending on how the air pressure in each channel 160 is set.

In particular embodiments, a fluid contained in channels 160 may be a hydraulic fluid (e.g., water or mineral oil). In particular embodiments, high-rigidity apparatus 120 may include a pump along with a reservoir configured to contain a portion of the hydraulic fluid. The pump may be configured to pump hydraulic fluid from the reservoir into one or more channels 160 of intermediate region 140 when the hydraulic fluid is in an active state. When hydraulic fluid or apparatus 120 is in an active state, the pump may pump the hydraulic fluid into channels 160, causing apparatus 120 to be in a high-rigidity state. When hydraulic fluid or apparatus 120 is in an inactive state, the pump may pump or allow a portion of the hydraulic fluid to flow into the reservoir, and apparatus 120 may have low rigidity and may be flexible. When apparatus 120 is in an active state, channels 160 may contain more hydraulic fluid or may have a higher fluid pressure than when apparatus 120 is inactive. In particular embodiments, a reservoir configured to contain hydraulic fluid may be configured as a layer contained in top sheet 130A, intermediate region 140, or bottom sheet 130B.

In particular embodiments, one or more supports 150 may be configured to contain a fluid within an enclosed volume of support 150. In particular embodiments, one or more supports 150 may each have a hollow interior region configured to contain an ER fluid, a MR fluid, a gas (e.g., air), or a hydraulic fluid. As an example and not by way of limitation, supports 150 may have a hollow interior region configured to contain air, and a compressor or air pump may pump air into the hollow regions of supports 150 to put the air into an active state where display device 100 is substantially rigid. As another example and not by way of limitation, supports 150 may have a hollow interior region configured to contain a hydraulic fluid, and a pump may pump the hydraulic fluid into the hollow regions of supports 150 to put display device into an active state. In particular embodiments, when the fluid is activated, one or more supports 150 may expand (vertically or horizontally) or may become substantially rigid.

In particular embodiments, channels 160 may be configured as tubes that may contain a fluid, such as for example, an ER fluid, a MR fluid, air, or a hydraulic fluid. As an example and not by way of limitation, flexible tubes formed by channels 160 may be woven through or combined with a fabric. When the fluid is activated, the fabric may become rigid, and when the fluid is inactive, the fabric may be flexible.

Figure 6:
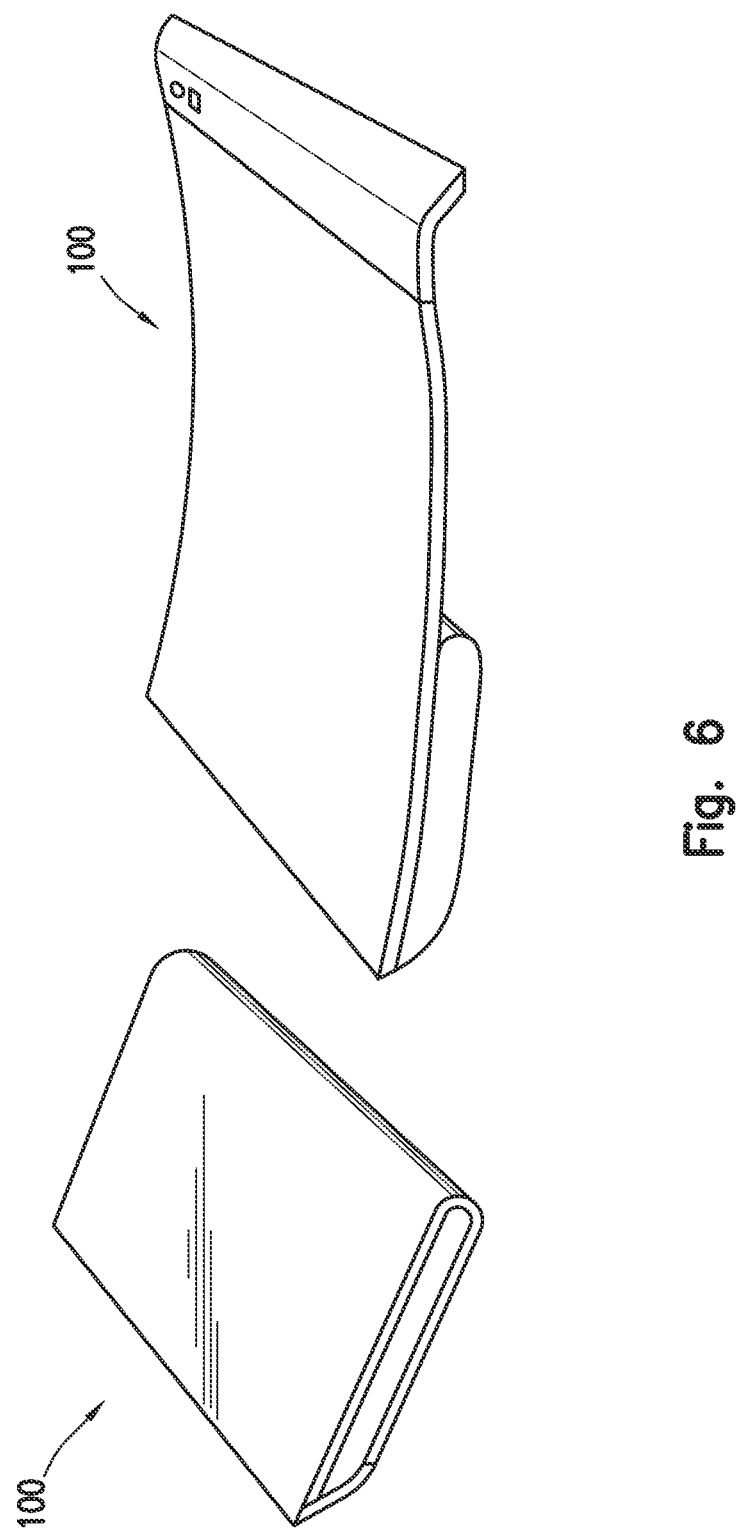
FIG. 6 illustrates an example display device in a folded configuration (on the left) and the example display device in an unfolded configuration (on the right).

FIG. 6 illustrates an example display device 100 in a folded configuration (on the left) and the example display device 100 in an unfolded configuration (on the right). In the folded configuration, display device 100 may be in an inactive state, and display device 100 may be configured to be folded to form a compact object that may be carried in a person's pocket or purse. In the folded configuration, the ends of display device 100 may fasten together (e.g., using magnets, a clasp, a snap fastener, or a hook-and-loop fastener). In the unfolded configuration, display device 100 may be in an active state, and display device 100 may be substantially rigid and may maintain a substantially flat or curved shape. In the unfolded, active state, a user may view information on flexible screen 110, or a user may interact with display device 100 (e.g., make a phone call or send a text message). In the example of FIG. 6, display device 100 may include a flexible display disposed on an outer surface that is exposed when device 100 is in the folded configuration. Additionally or as an alternative, display device 100 may include a flexible display disposed on an inner surface that is hidden from view when device 100 is in the folded configuration. Display device 100 in FIG. 6 may be configured to operate as a cellular phone or smart phone in the folded configuration and as a tablet computing device in the unfolded configuration.

Figure 7:
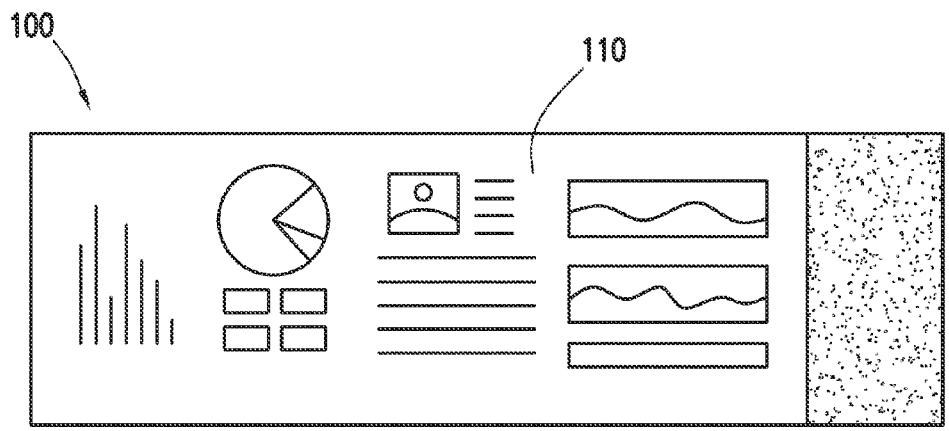
FIG. 7 illustrates an example display device in a substantially flat configuration (upper portion of figure) and a substantially curved or circular configuration (lower portion).
Figure 7:
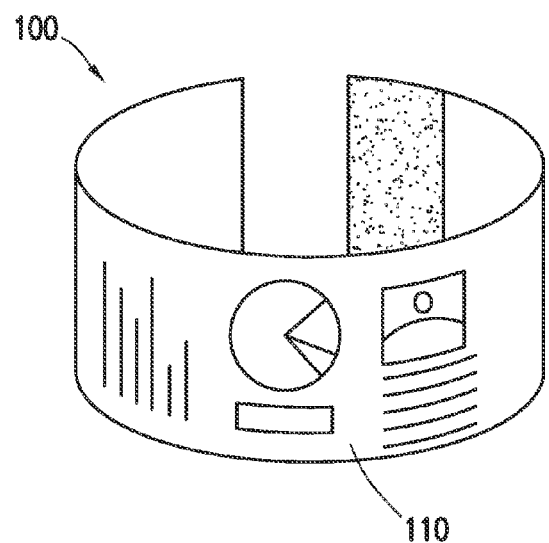

FIG. 7 illustrates an example display device 100 in a substantially flat configuration (upper portion of figure) and a substantially curved or circular configuration (lower portion). In the curved configuration, display device 100 may be in an inactive state, and display device 100 may be configured to be rolled up into a circular or spiral shape (e.g., for storage) or formed into a curved shape, as illustrated in FIG. 7. As an example and not by way of limitation, display device 100 may be configured to act as a portable screen, sign, or banner (e.g., a billboard or roadside display, or a video screen or a sign or banner for an event, such as for example, signage for a trade show). In the inactive state (as illustrated in the lower portion of FIG. 7), display device 100 may be rolled up into a compact shape for storage or transport, and in the active state, display device 100 may maintain a substantially flat or curved shape to display a video or image. Two or more display devices 100 may be combined together to form a large-format screen, sign, or banner. As another example and not by way of limitation, in an inactive state, display device 100 illustrated in the lower portion of FIG. 7, may be configured to be worn around a part of a person's body, such as for example, a person's wrist or arm. In the curved configuration, the ends of display device 100 may fasten together (e.g., using magnets, a clasp, a snap fastener, or a hook-and-loop fastener). In the flat configuration, display device 100 may be in an active state, and display device 100 may be substantially rigid and may maintain a substantially flat shape. In the flat, active state, a user may view information on flexible display 110, or a user may interact with display device 100. In particular embodiments, flexible display 110 may include a touch sensor allowing a user to interact with information displayed on flexible display 110.

Figure 8:
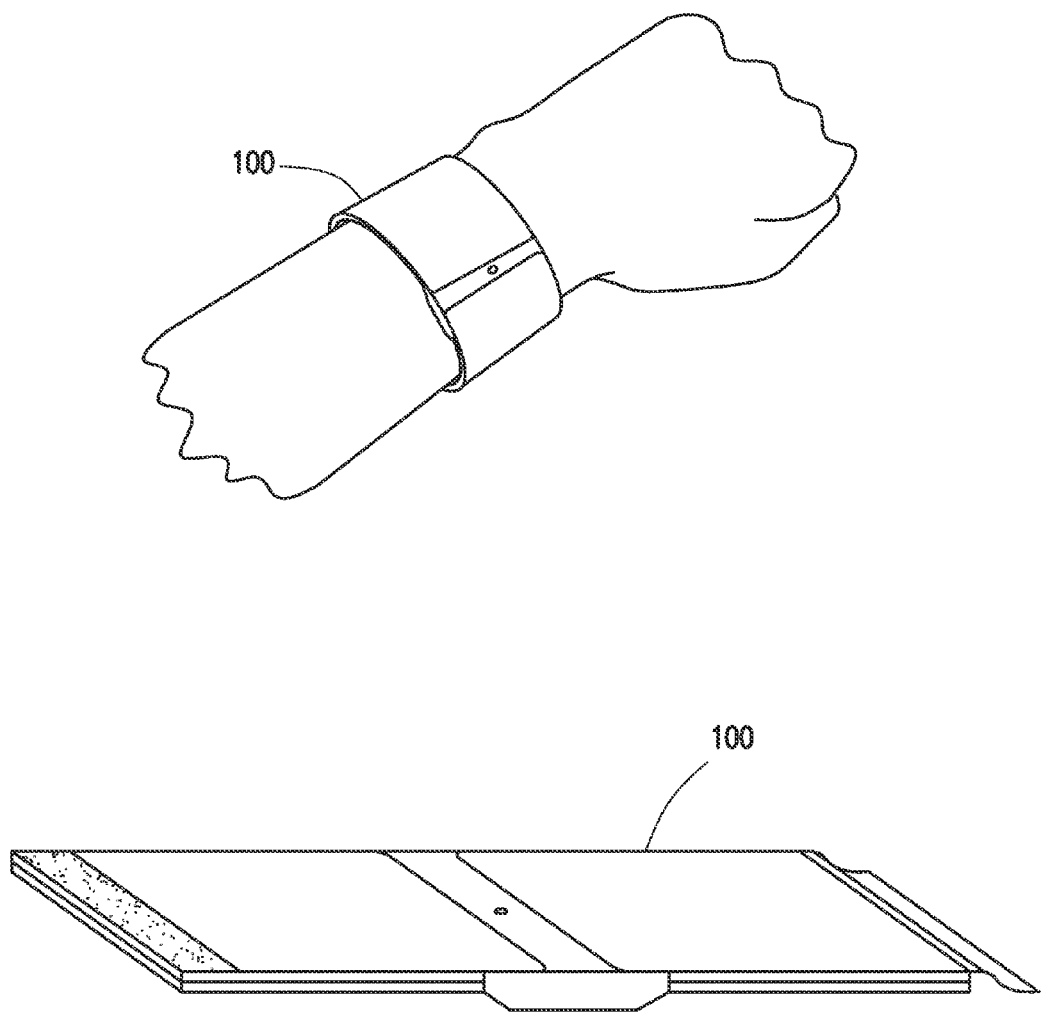
FIG. 8 illustrates an example display device worn around a user's wrist (upper portion of figure) and the example display device in a substantially flat configuration (lower portion).

FIG. 8 illustrates an example display device 100 worn around a user's wrist (upper portion of figure) and the example display device 100 in a substantially flat configuration (lower portion). In particular embodiments, display device 100 may be configured to be worn on or around a person's body or a part of a person's body. As an example and not by way of limitation, display device 100 may be worn around a person's wrist, arm, ankle, leg, neck, or forehead. In the example of FIG. 8, display device 100 is worn around a person's wrist (e.g., similar to a watch, bracelet, or wrist band), and display device 100 may open to form a substantially flat, rigid device (e.g., a smartphone or a computing device with a touch sensor display). When worn around a user's wrist, display device 100 may be in an inactive state, and the ends of display device 100 may be fastened together. In the flat configuration, display device 100 may be in an active state, and display device 100 may be substantially rigid and may maintain a substantially flat shape.

Figure 9:
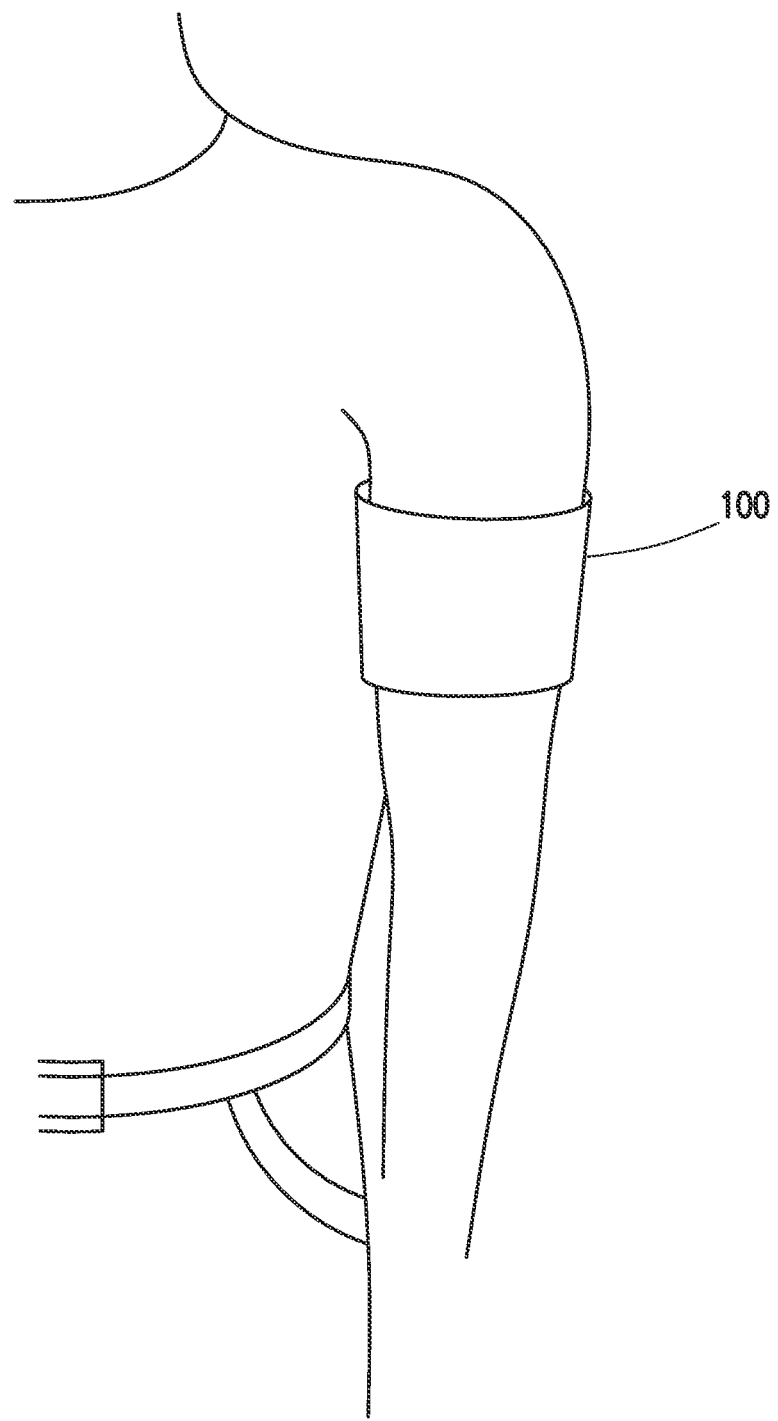
FIG. 9 illustrates an example display device fastened around a user's upper arm.

FIG. 9 illustrates an example display device 100 fastened around a user's upper arm. As an example and not by way of limitation, the example display device 100 of FIG. 7 may be configured to be worn around a person's upper arm, as illustrated in FIG. 9. In particular embodiments, display device 100 may be configured to be wrapped around a part of a person's body when the fluid is in the inactive state. When display device 100 is inactive, display device 100 may be flexible and may readily wrap around a part of a person's body. In particular embodiments, after being wrapped around a part of a person's body, display device 100 may be configured to activate the fluid into an active or semi-active state so that display device 100 makes a persistent snug fit to the part of the person's body or conforms to a persistent shape of the part of the person's body. As an example and not by way of limitation, after wrapping display device 100 around a user's upper arm, the user may be able to activate the fluid to a semi-active state so that display device 100 makes a persistent snug fit to the user's arm, staying in place but not causing discomfort to the user.

In particular embodiments, display device 100 may function as an identification tag or a medical information bracelet. As an example and not by way of limitation, display device 100 may be worn on a patient's body and may store personal or medical information (e.g., the patient's name, address, phone number, date of birth, drug allergies, medications, or medical condition). Display device 100 may be removed from the patient's body and activated so that the patient's personal or medical information can be reviewed or updated. As another example and not by way of limitation, display device 100 may be configured to measure, monitor, or record a patient's vital signs or other physical indicators, such as for example body temperature, blood pressure, pulse rate, breathing rate, or oxygen saturation. For example, display device 100 may measure blood pressure by activating display device 100 to function like an inflatable cuff of a sphygmomanometer, and display device 100 may also include a device to measure pressure and a device to monitor a person's pulse. Display device 100 may be removed from the patient's body and activated so that medical personnel may view or interact with data stored in or recorded by display device 100.

Figure 10:
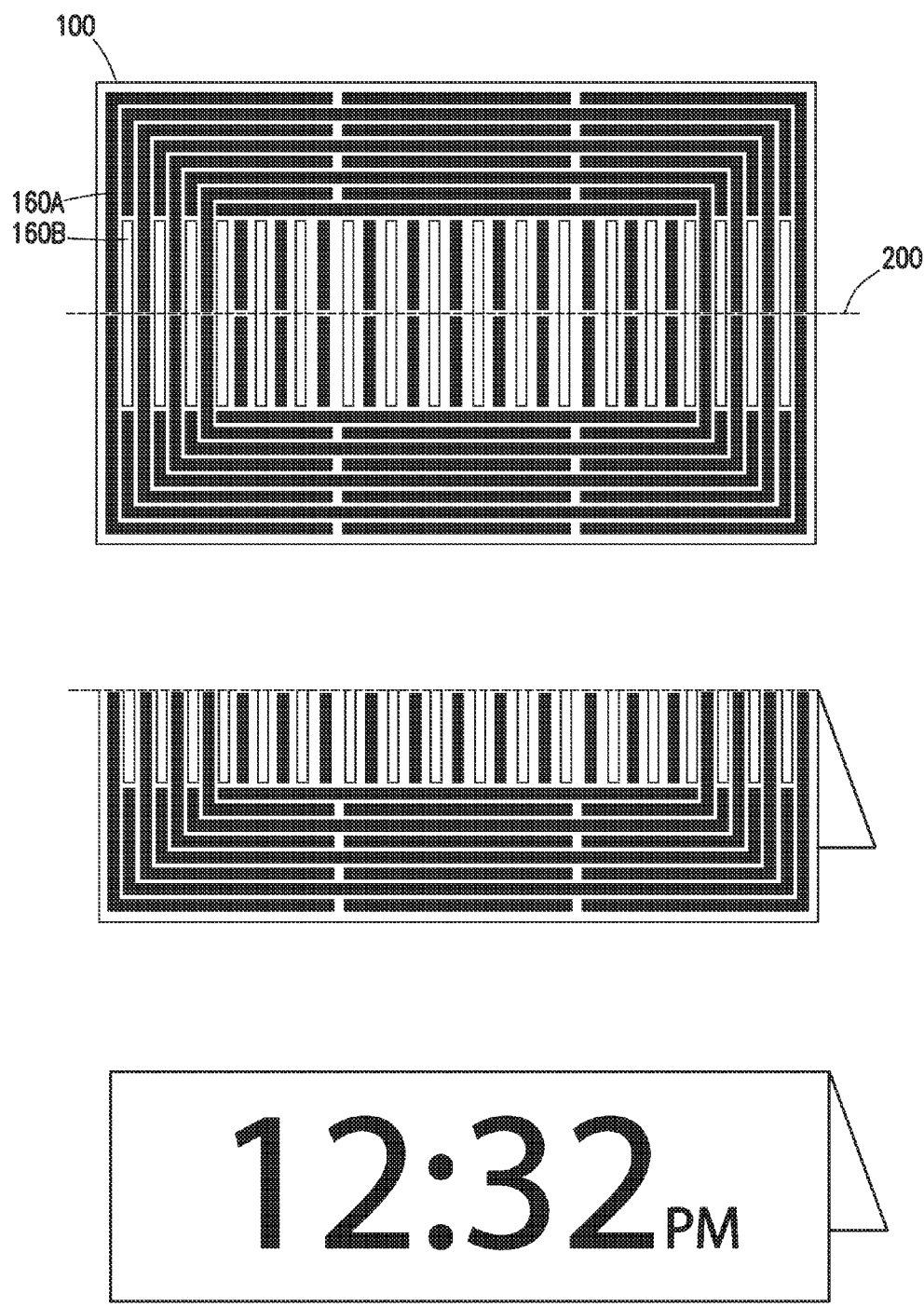
FIGS. 10-12 illustrate an example foldable display device configured as a clock, phone, and compact information display, respectively.
Figure 11:
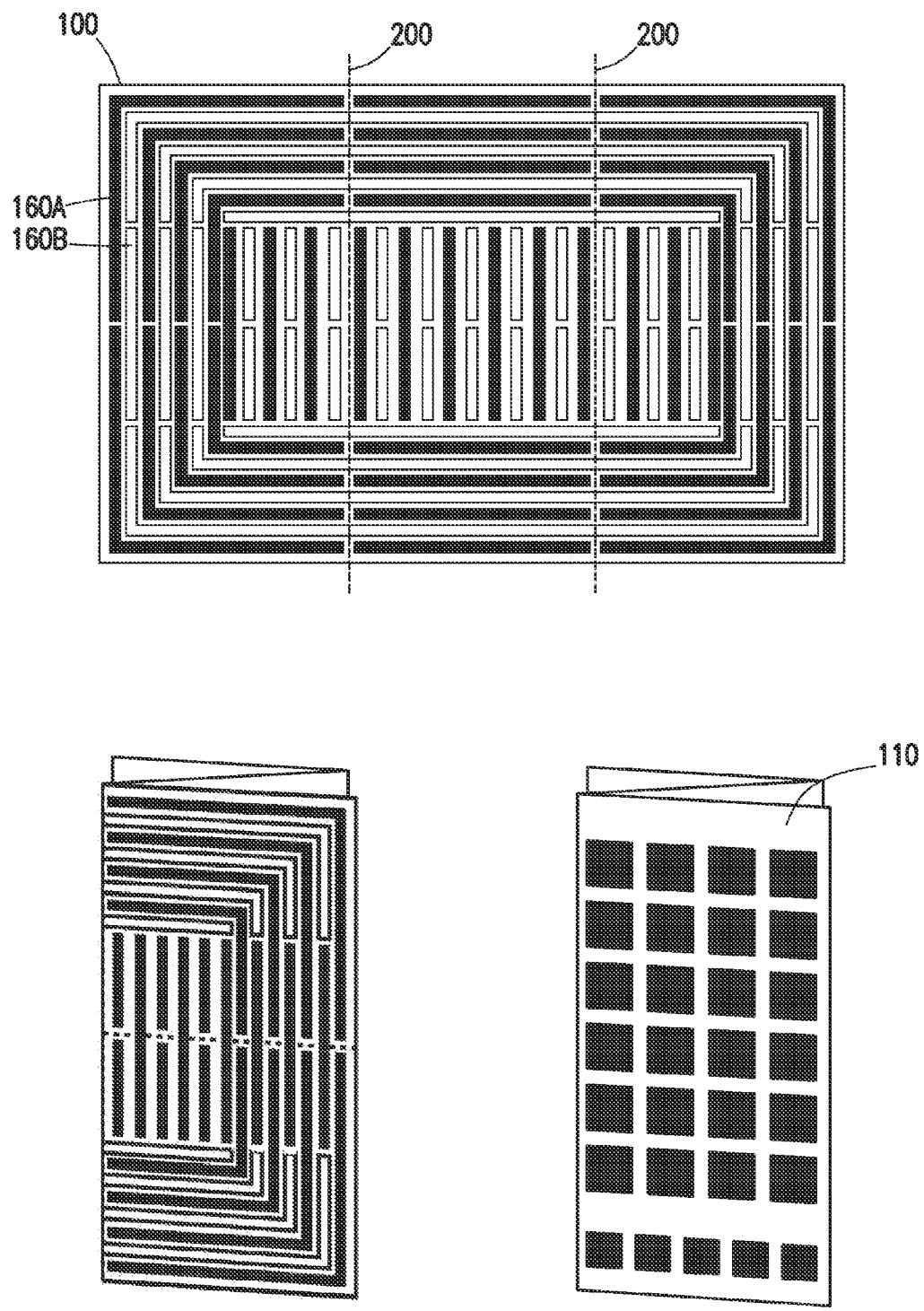
Figure 12:
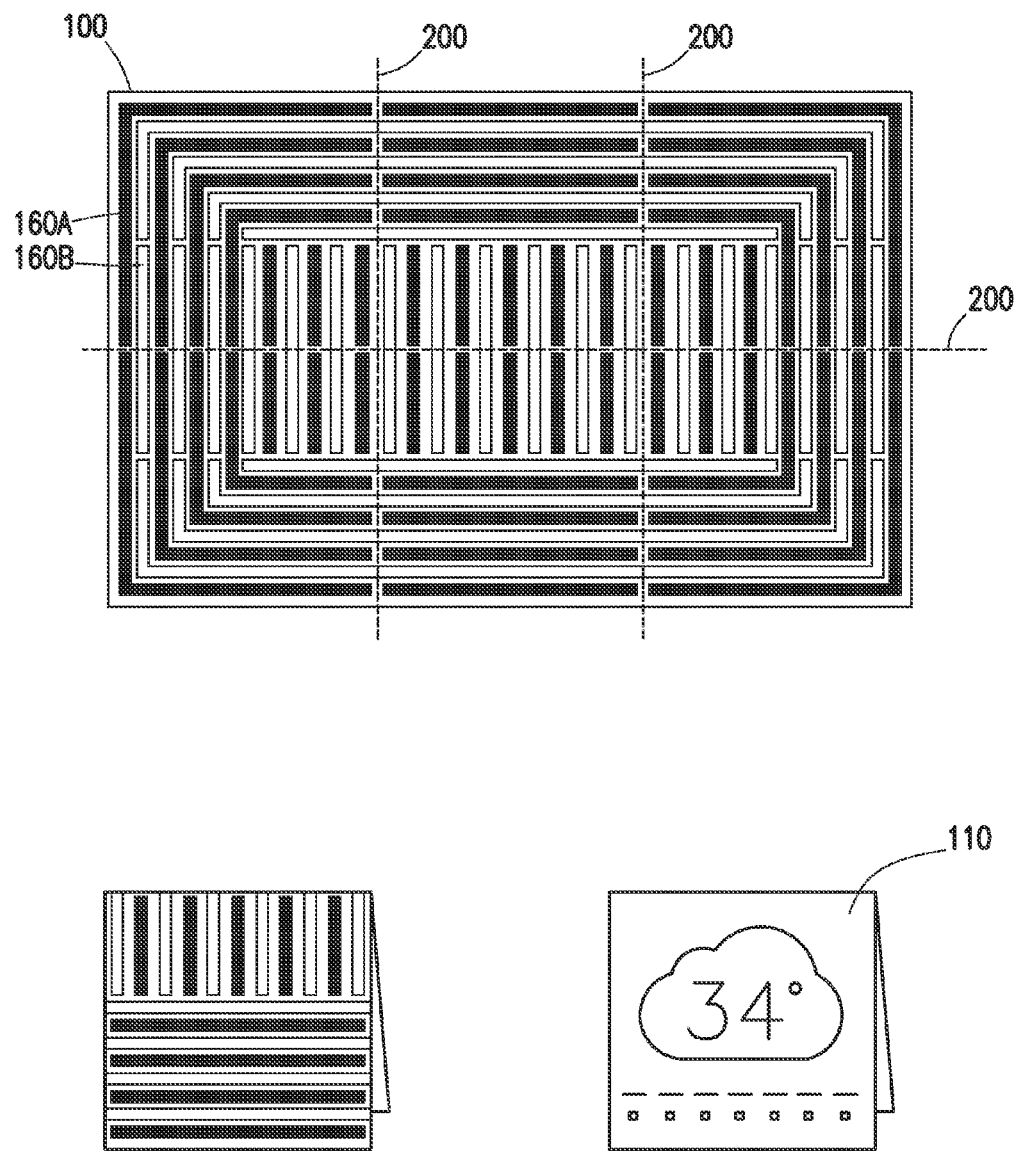

FIGS. 10-12 illustrate an example foldable display device 100 configured as a clock, phone, and compact information display, respectively. In particular embodiments, display device 100 may include multiple channels 160, and the fluid in each channel 160 may be selectively put into an active or inactive state. In the examples of FIGS. 10-12, channels 160A (with black interiors) represent channels with fluid in an active state, while channels 160B (with white interiors) represent channels with fluid in an inactive state. As an example and not by way of limitation, display device 100 may include multiple electrodes configured to selectively activate portions of an ER fluid contained in channels 160. In particular embodiments, the fluid in display device 100 may be activated in multiple configurations so that display device 100 may take on multiple respective shapes. As an example and not by way of limitation, when all or most of the fluid in display device 100 is activated, display device 100 may take on a substantially flat shape (with no folded portions) and may function as a tablet device.

In particular embodiments, display device 100 may be configured to flex or fold along one or more fold lines 200. The configuration of which channels 160A are activated and which channels 160B are inactive may determine a location and number of fold lines 200 about which display device 100 may fold. In particular embodiments, fluid in channels 160A that do not cross a fold line 200 may be activated, and fluid in channels 160B that cross a fold line 200 may remain in an inactive state. In the example of FIG. 10, foldable display device 100 is configured to fold along fold line 200 to form a clock display, as shown in the lower portion of FIG. 10. As indicated in the example of FIG. 10, channels 160A that do not cross fold line 200 are activated, while channels 160B that cross fold line 200 are inactive. The two portions of display device 100 on either side of fold line 200 may be in a substantially flat and rigid state, and based on the configuration of active and inactive channels 160, display device may be able to flex or fold along fold line 200. FIG. 11 illustrates another configuration where display device 100 is configured to fold along two fold lines 200 to form a phone as illustrated in the lower right portion of FIG. 11. Again, fluid in channels 160B that cross a fold line 200 are in an inactive state (indicated by white interiors), while fluid in channels 160A that do not cross a fold line 200 are active (indicated by black interiors). In the example of FIG. 12, display device 100 is configured to have three fold lines 200 formed by activated channels 160B that do not cross the fold lines 200. When folded along fold lines 200 as illustrated in FIG. 12, display device 100 forms a compact information display (e.g., to display a calendar, the weather, or the current temperature). Although this disclosure describes and illustrates particular display devices configured to flex or fold into particular shapes, this disclosure contemplates any suitable display devices configured to flex or fold into any suitable shapes.

Figure 13:
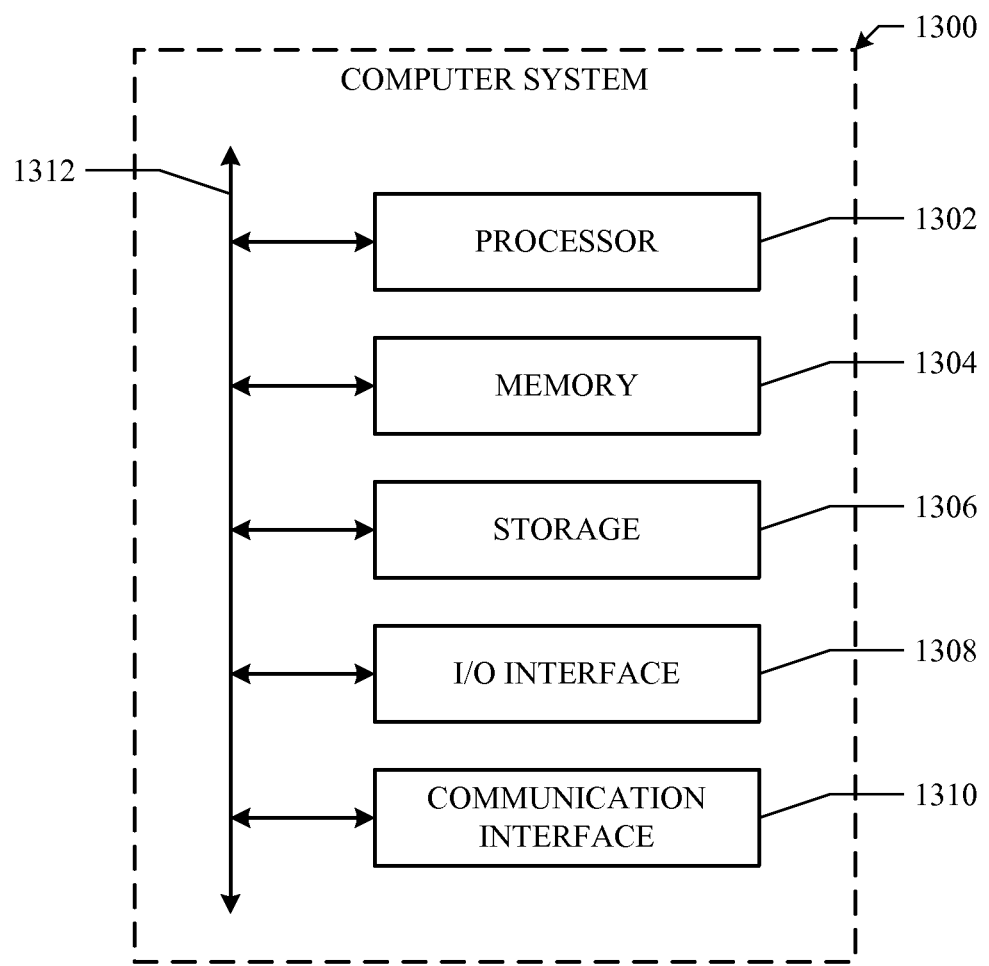
FIG. 13 illustrates an example computer system.

FIG. 13 illustrates an example computer system 1300. In particular embodiments, one or more computer systems 1300 perform one or more steps of one or more methods described or illustrated herein. In particular embodiments, one or more computer systems 1300 provide functionality described or illustrated herein. In particular embodiments, software running on one or more computer systems 1300 performs one or more steps of one or more methods described or illustrated herein or provides functionality described or illustrated herein. Particular embodiments include one or more portions of one or more computer systems 1300. Herein, reference to a computer system may encompass a computing device, and vice versa, where appropriate. Moreover, reference to a computer system may encompass one or more computer systems, where appropriate.

This disclosure contemplates any suitable number of computer systems 1300. This disclosure contemplates computer system 1300 taking any suitable physical form. As example and not by way of limitation, computer system 1300 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, or a combination of two or more of these. Where appropriate, computer system 1300 may include one or more computer systems 1300; be unitary or distributed; span multiple locations; span multiple machines; span multiple data centers; or reside in a cloud, which may include one or more cloud components in one or more networks. Where appropriate, one or more computer systems 1300 may perform without substantial spatial or temporal limitation one or more steps of one or more methods described or illustrated herein. As an example and not by way of limitation, one or more computer systems 1300 may perform in real time or in batch mode one or more steps of one or more methods described or illustrated herein. One or more computer systems 1300 may perform at different times or at different locations one or more steps of one or more methods described or illustrated herein, where appropriate.

In particular embodiments, computer system 1300 includes a processor 1302, memory 1304, storage 1306, an input/output (I/O) interface 1308, a communication interface 1310, and a bus 1312. Although this disclosure describes and illustrates a particular computer system having a particular number of particular components in a particular arrangement, this disclosure contemplates any suitable computer system having any suitable number of any suitable components in any suitable arrangement.

In particular embodiments, processor 1302 includes hardware for executing instructions, such as those making up a computer program. As an example and not by way of limitation, to execute instructions, processor 1302 may retrieve (or fetch) the instructions from an internal register, an internal cache, memory 1304, or storage 1306; decode and execute them; and then write one or more results to an internal register, an internal cache, memory 1304, or storage 1306. In particular embodiments, processor 1302 may include one or more internal caches for data, instructions, or addresses. This disclosure contemplates processor 1302 including any suitable number of any suitable internal caches, where appropriate. As an example and not by way of limitation, processor 1302 may include one or more instruction caches, one or more data caches, and one or more translation lookaside buffers (TLBs). Instructions in the instruction caches may be copies of instructions in memory 1304 or storage 1306, and the instruction caches may speed up retrieval of those instructions by processor 1302. Data in the data caches may be copies of data in memory 1304 or storage 1306 for instructions executing at processor 1302 to operate on; the results of previous instructions executed at processor 1302 for access by subsequent instructions executing at processor 1302 or for writing to memory 1304 or storage 1306; or other suitable data. The data caches may speed up read or write operations by processor 1302. The TLBs may speed up virtual-address translation for processor 1302. In particular embodiments, processor 1302 may include one or more internal registers for data, instructions, or addresses. This disclosure contemplates processor 1302 including any suitable number of any suitable internal registers, where appropriate. Where appropriate, processor 1302 may include one or more arithmetic logic units (ALUs); be a multi-core processor; or include one or more processors 1302. Although this disclosure describes and illustrates a particular processor, this disclosure contemplates any suitable processor.

In particular embodiments, memory 1304 includes main memory for storing instructions for processor 1302 to execute or data for processor 1302 to operate on. As an example and not by way of limitation, computer system 1300 may load instructions from storage 1306 or another source (such as, for example, another computer system 1300) to memory 1304. Processor 1302 may then load the instructions from memory 1304 to an internal register or internal cache. To execute the instructions, processor 1302 may retrieve the instructions from the internal register or internal cache and decode them. During or after execution of the instructions, processor 1302 may write one or more results (which may be intermediate or final results) to the internal register or internal cache. Processor 1302 may then write one or more of those results to memory 1304. In particular embodiments, processor 1302 executes only instructions in one or more internal registers or internal caches or in memory 1304 (as opposed to storage 1306 or elsewhere) and operates only on data in one or more internal registers or internal caches or in memory 1304 (as opposed to storage 1306 or elsewhere). One or more memory buses (which may each include an address bus and a data bus) may couple processor 1302 to memory 1304. Bus 1312 may include one or more memory buses, as described below. In particular embodiments, one or more memory management units (MMUs) reside between processor 1302 and memory 1304 and facilitate accesses to memory 1304 requested by processor 1302. In particular embodiments, memory 1304 includes random access memory (RAM). This RAM may be volatile memory, where appropriate, and this RAM may be dynamic RAM (DRAM) or static RAM (SRAM), where appropriate. Moreover, where appropriate, this RAM may be single-ported or multi-ported RAM. This disclosure contemplates any suitable RAM. Memory 1304 may include one or more memories 1304, where appropriate. Although this disclosure describes and illustrates particular memory, this disclosure contemplates any suitable memory.

In particular embodiments, storage 1306 includes mass storage for data or instructions. As an example and not by way of limitation, storage 1306 may include a hard disk drive (HDD), a floppy disk drive, flash memory, an optical disc, a magneto-optical disc, magnetic tape, or a Universal Serial Bus (USB) drive or a combination of two or more of these. Storage 1306 may include removable or non-removable (or fixed) media, where appropriate. Storage 1306 may be internal or external to computer system 1300, where appropriate. In particular embodiments, storage 1306 is non-volatile, solid-state memory. In particular embodiments, storage 1306 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 1306 taking any suitable physical form. Storage 1306 may include one or more storage control units facilitating communication between processor 1302 and storage 1306, where appropriate. Where appropriate, storage 1306 may include one or more storages 1306. Although this disclosure describes and illustrates particular storage, this disclosure contemplates any suitable storage.

In particular embodiments, I/O interface 1308 includes hardware, software, or both, providing one or more interfaces for communication between computer system 1300 and one or more I/O devices. Computer system 1300 may include one or more of these I/O devices, where appropriate. One or more of these I/O devices may enable communication between a person and computer system 1300. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 1308 for them. Where appropriate, I/O interface 1308 may include one or more device or software drivers enabling processor 1302 to drive one or more of these I/O devices. I/O interface 1308 may include one or more I/O interfaces 1308, where appropriate. Although this disclosure describes and illustrates a particular I/O interface, this disclosure contemplates any suitable I/O interface.

In particular embodiments, communication interface 1310 includes hardware, software, or both providing one or more interfaces for communication (such as, for example, packet-based communication) between computer system 1300 and one or more other computer systems 1300 or one or more networks. As an example and not by way of limitation, communication interface 1310 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 1310 for it. As an example and not by way of limitation, computer system 1300 may communicate with an ad hoc network, a personal area network (PAN), a local area network (LAN), a wide area network (WAN), a metropolitan area network (MAN), body area network (BAN), or one or more portions of the Internet or a combination of two or more of these. One or more portions of one or more of these networks may be wired or wireless. As an example, computer system 1300 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 1300 may include any suitable communication interface 1310 for any of these networks, where appropriate. Communication interface 1310 may include one or more communication interfaces 1310, where appropriate. Although this disclosure describes and illustrates a particular communication interface, this disclosure contemplates any suitable communication interface.

In particular embodiments, bus 1312 includes hardware, software, or both coupling components of computer system 1300 to each other. As an example and not by way of limitation, bus 1312 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 1312 may include one or more buses 1312, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This scope of this disclosure encompasses all changes, substitutions, variations, alterations, and modifications to the example embodiments herein that a person having ordinary skill in the art would comprehend. The scope of this disclosure is not limited to the example embodiments described or illustrated herein. Moreover, although this disclosure describes or illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A device comprising:
   a first sheet configured to flex, wherein the first sheet comprises one or more first electrodes;
   a second sheet disposed below the first sheet, wherein the second sheet comprises one or more second electrodes; and
   an intermediate region disposed between the sheets, the intermediate region comprising:
     a plurality of supports, each of the supports connected to portions of the first and second sheets and configured to maintain a spacing between the sheets;
     a plurality of channels configured to contain a fluid in the spacing between the sheets, each of the channels disposed between two or more supports; and
     the fluid, configured to be in an active or an inactive state, wherein:
       when the fluid is in the inactive state, the device is substantially flexible; and
       when the fluid is in the active state, the device is substantially rigid,
   wherein the first and second electrodes are configured to:
     receive a voltage applied between one or more of the first and second electrodes; and
     produce an electric field between the one or more first and second electrodes, the electric field extending through the fluid of one or more channels of the intermediate region, and the electric field having a magnitude proportional to the applied voltage.

2. The device of claim 1, wherein the first sheet comprises a flexible display.

3. The device of claim 1, wherein the device further comprises a flexible display attached to an outer surface of the first sheet.

4. The device of claim 1, wherein the intermediate region comprises a sandwich structure with the first and second sheets, wherein when the intermediate region is flexed into a shape, the first sheet flexes into a shape that is similar to the shape of the intermediate region.

5. The device of claim 1, wherein:
the fluid is an electrically controlled fluid;
the electrically controlled fluid is in the inactive state when the applied voltage is approximately zero; and
the electrically controlled fluid is in the active state when the applied voltage is nonzero.

6. The device of claim 5, wherein the electrically controlled fluid comprises an electrorheological fluid.

7. The device of claim 1, wherein:
the device further comprises one or more electromagnets configured to receive an electric current and produce a magnetic field based on the received electric current;
the fluid is a magnetically controlled fluid;
the magnetically controlled fluid is in the inactive state when no current is applied to the electromagnets; and
the magnetically controlled fluid is in the active state when one or more currents are applied to one or more of the respective electromagnets.

8. The device of claim 7, wherein the magnetically controlled fluid is a magnetorheological fluid.

9. The device of claim 1, wherein:
the fluid is air; and
the device further comprises a pump configured to pump the air into one or more channels of the intermediate region when the air is in the active state.

10. The device of claim 1, wherein:
the fluid is a hydraulic fluid; and
the device further comprises:
    a reservoir configured to contain a portion of the hydraulic fluid; and
    a pump configured to pump hydraulic fluid from the reservoir into one or more channels of the intermediate region when the hydraulic fluid is in the active state.

11. The device of claim 1, wherein a portion of the device is configured to maintain a substantially flat shape when the fluid is in the active state.

12. The device of claim 1, wherein a portion of the device is configured to maintain a substantially curved shape when the fluid is in the active state.

13. The device of claim 1, wherein the device is configured to be worn on a person's body.

14. The device of claim 1, wherein the device is configured to:
be wrapped around a part of a person's body when the fluid is in the inactive state; and
after being wrapped around the part of the person's body, activate the fluid into the active state wherein the device makes a persistent snug fit to the part of the person's body or conforms to a persistent shape of the part of the person's body.

15. The device of claim 1, wherein the fluid is further configured to be in a semi-active state, wherein when the fluid is in the semi-active state, the device is semi-rigid and has a rigidity between the substantially flexible inactive state and the substantially rigid active state.

16. A system comprising:
a first sheet configured to flex;
a second sheet disposed below the first sheet;
an intermediate region disposed between the sheets, the intermediate region comprising:
    a plurality of supports, each of the supports connected to portions of the first and second sheets and configured to maintain a spacing between the sheets;
    a plurality of channels configured to contain a fluid in the spacing between the sheets, each of the channels disposed between two or more supports; and
    the fluid, configured to be in an active or an inactive state, wherein:
        when the fluid is in the inactive state, the system is substantially flexible; and
        when the fluid is in the active state, the system is substantially rigid; and
one or more computer-readable non-transitory storage media embodying logic that is configured when executed to control the state of the fluid.

17. The system of claim 16, wherein:
the first sheet comprises one or more first electrodes;
the second sheet comprises one or more second electrodes; and
the first and second electrodes are configured to:
    receive a voltage applied between one or more of the first and second electrodes; and
    produce an electric field between the one or more first and second electrodes, the electric field extending through the fluid of one or more channels of the intermediate region, and the electric field having a magnitude proportional to the applied voltage.

18. The system of claim 16, wherein the first sheet comprises a flexible display.

19. The system of claim 16, wherein the system further comprises a flexible display attached to an outer surface of the first sheet.

20. An apparatus comprising:
an intermediate region configured to be disposed between a first sheet comprising one or more first electrodes and a second sheet comprising one or more second electrodes, the first sheet being configured to flex, the intermediate region comprising:
    a plurality of supports, each of the supports connected to portions of the first and second sheets and configured to maintain a spacing between the sheets;
    a plurality of channels configured to contain a fluid in the spacing between the sheets, each of the channels disposed between two or more supports; and
    the fluid, configured to be in an active or an inactive state, wherein:
        when the fluid is in the inactive state, the apparatus is substantially flexible; and
        when the fluid is in the active state, the apparatus is substantially rigid,
wherein the first and second electrodes are configured to:
    receive a voltage applied between one or more of the first and second electrodes; and
    produce an electric field between the one or more first and second electrodes, the electric field extending through the fluid of one or more channels of the intermediate region, and the electric field having a magnitude proportional to the applied voltage.

* * * * *